(12) United States Patent
Chiang et al.

(10) Patent No.: US 12,432,875 B2
(45) Date of Patent: Sep. 30, 2025

(54) IMMERSION COOLING UNIT AND ELECTRONIC APPARATUS

(71) Applicant: Wistron Corporation, New Taipei (TW)

(72) Inventors: Cheng Han Chiang, New Taipei (TW); Shao-Jen Chu, New Taipei (TW); Cheng Wei Chen, New Taipei (TW)

(73) Assignee: Wistron Corporation, New Taipei (TW)

( * ) Notice: Subject to any disclaimer, the term of this patent is extended or adjusted under 35 U.S.C. 154(b) by 231 days.

(21) Appl. No.: 18/077,160

(22) Filed: Dec. 7, 2022

(65) Prior Publication Data

US 2024/0049424 A1 Feb. 8, 2024

(30) Foreign Application Priority Data

Aug. 2, 2022 (TW) .................................. 111129016

(51) Int. Cl.
 *H05K 7/20* (2006.01)
(52) U.S. Cl.
 CPC ..... *H05K 7/20236* (2013.01); *H05K 7/20272* (2013.01); *H05K 7/20409* (2013.01); *H05K 7/20481* (2013.01); *H05K 7/20627* (2013.01)
(58) Field of Classification Search
 CPC ........... H05K 7/20236; H05K 7/20272; H05K 7/20409; H05K 7/20481; H05K 7/20627; H05K 7/20436; H05K 7/20418
 (Continued)

(56) References Cited

U.S. PATENT DOCUMENTS 9,622,379 B1 * 4/2017 Campbell .......... H05K 7/20318
10,747,276 B2 8/2020 Chen
(Continued)

FOREIGN PATENT DOCUMENTS

CN 114340332 A * 4/2022 ......... H05K 7/20236
GB 2576032 2/2020
(Continued)

OTHER PUBLICATIONS

"Search Report of Europe Counterpart Application", issued on Aug. 21, 2023, p. 1-p. 12.
(Continued)

*Primary Examiner* — Mandeep S Buttar
*Assistant Examiner* — Kyle Oxenknecht
(74) *Attorney, Agent, or Firm* — JCIPRNET (57) ABSTRACT

An immersion cooling unit including a cooling tank, a first cooling unit, and a second cooling unit is provided. The cooling tank includes an accommodating portion and a top. The immersion cooling unit is a single-phase cooling unit. The first cooling unit is connected to the cooling tank. The first cooling unit and the second cooling unit are disposed opposite to each other. The second cooling unit includes a cover portion and a connection portion. The cover portion is connected to the top of the cooling tank and covers the accommodating portion. The connection portion is connected to the cover portion and located in the accommodating portion. In addition, an electronic apparatus including the above immersion cooling unit is further provided. The immersion cooling unit and the electronic apparatus are capable of improving cooling efficiency of the immersion cooling unit on a heat generating component.

18 Claims, 6 Drawing Sheets

(58) Field of Classification Search
USPC .......................................................... 361/688
See application file for complete search history.

(56) References Cited

U.S. PATENT DOCUMENTS

| | | | |
|---|---|---|---|
| 10,888,032 | B2 | 1/2021 | Wakino et al. |
| 2011/0315343 | A1 | 12/2011 | Campbell et al. |
| 2012/0188714 | A1* | 7/2012 | Von Borck .......... H01M 10/653 |
| | | | 361/748 |
| 2018/0020570 | A1* | 1/2018 | Fujiwara ............ H05K 7/20318 |
| 2018/0092243 | A1* | 3/2018 | Saito ..................... H01L 23/473 |
| 2019/0098796 | A1* | 3/2019 | Wakino .............. H05K 7/20272 |
| 2019/0297747 | A1 | 9/2019 | Wakino et al. |
| 2019/0377391 | A1* | 12/2019 | Chen ..................... H01L 23/473 |
| 2021/0185850 | A1 | 6/2021 | Kulkarni et al. |
| 2022/0361377 | A1* | 11/2022 | Chu .................. H05K 7/20327 |

FOREIGN PATENT DOCUMENTS

| | | | | |
|---|---|---|---|---|
| KR | 20210130542 A | * | 11/2021 | ......... H05K 7/20272 |
| TW | 202001488 | | 1/2020 | |
| WO | 2018135327 | | 7/2018 | |
| WO | 2019015321 | | 1/2019 | |

OTHER PUBLICATIONS

"Office Action of Taiwan Counterpart Application", issued on Feb. 2, 2023, p. 1-p. 6.

* cited by examiner

IMMERSION COOLING UNIT AND ELECTRONIC APPARATUS

CROSS-REFERENCE TO RELATED APPLICATION

This application claims the priority benefit of Taiwan application serial no. 111129016, filed on Aug. 2, 2022. The entirety of the above-mentioned patent application is hereby incorporated by reference herein and made a part of this specification.

BACKGROUND

Technical Field

The disclosure relates to a cooling unit and an apparatus, in particular to an immersion cooling unit and an electronic apparatus.

Description of Related Art

With the technological innovation and business model change, the demand for 5G network communication, artificial intelligence Internet of Things, artificial intelligence, cloud service, etc. has increased dramatically, resulting in the data center processing more data. In order to maintain the performance and stability of the server, the cooling demand for the heat generating components in the server has increased accordingly. Traditional cooling methods not only consume energy, but also cannot solve the cooling problem of high wattage systems, so the increase in power density is driving the demand for higher technology cooling. Therefore, how to improve the cooling efficiency of heat generating components is an urgent issue in this field.

SUMMARY

The disclosure provides an immersion cooling unit and an electronic apparatus, capable of improving cooling efficiency of the immersion cooling unit on a heat generating component.

The immersion cooling unit of the disclosure includes a cooling tank, a first cooling unit, and a second cooling unit. The cooling tank includes an accommodating portion and a top, and the immersion cooling unit is a single-phase cooling unit. The first cooling unit is connected to the cooling tank. The first cooling unit and the second cooling unit are disposed opposite to each other. The second cooling unit includes a cover portion and a connection portion. The cover portion is connected to the top of the cooling tank and covers the accommodating portion. The connection portion is connected to the cover portion and is located in the accommodating portion.

According to an embodiment of the disclosure, the cooling tank includes a bottom opposite to the top, and the first cooling unit is connected to the bottom of the cooling tank.

According to an embodiment of the disclosure, the connection portion is a cooling fin set.

According to an embodiment of the disclosure, the immersion cooling unit further includes a thermal pad. The thermal pad is disposed between the cover portion and the connection portion.

According to an embodiment of the disclosure, the immersion cooling unit further includes two water cooling pipes. The two water cooling pipes are respectively disposed in the cover portion and the first cooling unit.

According to an embodiment of the disclosure, the immersion cooling unit further includes a submerged pump. The submerged pump is disposed in the cooling tank.

According to an embodiment of the disclosure, the cooling tank has a cooling medium replacement portion.

According to an embodiment of the disclosure, the cooling tank includes a main body and a connection interface, and the connection interface is disposed on a side of the main body. The cooling medium replacement portion is located at the connection interface.

According to an embodiment of the disclosure, the connection interface includes an electrical connection portion.

According to an embodiment of the disclosure, a cooling medium is accommodated in the accommodating portion of the cooling tank, and there is a gap between a liquid surface of the cooling medium and the cover portion.

An electronic apparatus of the disclosure includes a rack, a heat generating component, and an immersion cooling unit. The immersion cooling unit is installed on the rack, and the immersion cooling unit includes a cooling tank, a first cooling unit, and a second cooling unit. The cooling tank includes an accommodating portion and a top, and the immersion cooling unit is a single-phase cooling unit. The first cooling unit is connected to the cooling tank. The first cooling unit and the second cooling unit are disposed opposite to each other. The second cooling unit includes a cover portion and a connection portion. The cover portion is connected to the top of the cooling tank and covers the accommodating portion. The connection portion is connected to the cover portion, and the connection portion is located in the accommodating portion and contacts the heat generating component.

According to one embodiment of the disclosure, the cooling tank includes a bottom opposite to the top, and the first cooling unit is connected to the bottom of the cooling tank.

According to an embodiment of the disclosure, the connection portion is a cooling fin set.

According to an embodiment of the disclosure, the immersion cooling unit includes a thermal pad. The thermal pad is disposed between the cover portion and the connection portion.

According to an embodiment of the disclosure, the immersion cooling unit includes two water cooling pipes. The two water cooling pipes are respectively disposed in the cover portion and the first cooling unit.

According to an embodiment of the disclosure, the immersion cooling unit includes a submerged pump. The submerged pump is disposed in the cooling tank.

According to an embodiment of the disclosure, the cooling tank has a cooling medium replacement portion.

According to an embodiment of the disclosure, the cooling tank includes a main body and a connection interface. The connection interface is disposed on a side of the main body, and the cooling medium replacement portion is located at the connection interface.

According to an embodiment of the disclosure, the connection interface includes an electrical connection portion.

According to an embodiment of the disclosure, a cooling medium is accommodated in the accommodating portion of the cooling tank, and there is a gap between a liquid surface of the cooling medium and the cover portion.

To make the aforementioned more comprehensible, several accompanied with drawings are described in detail as follows.

BRIEF DESCRIPTION OF THE DRAWING

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The disclosure is more fully described by reference to the drawings of the embodiments. However, the disclosure may also be embodied in various different forms and should not be limited to the embodiments described herein. Identical or similar reference numerals denote identical or similar elements, which will not be repeated in the following paragraphs.

Figure 1:
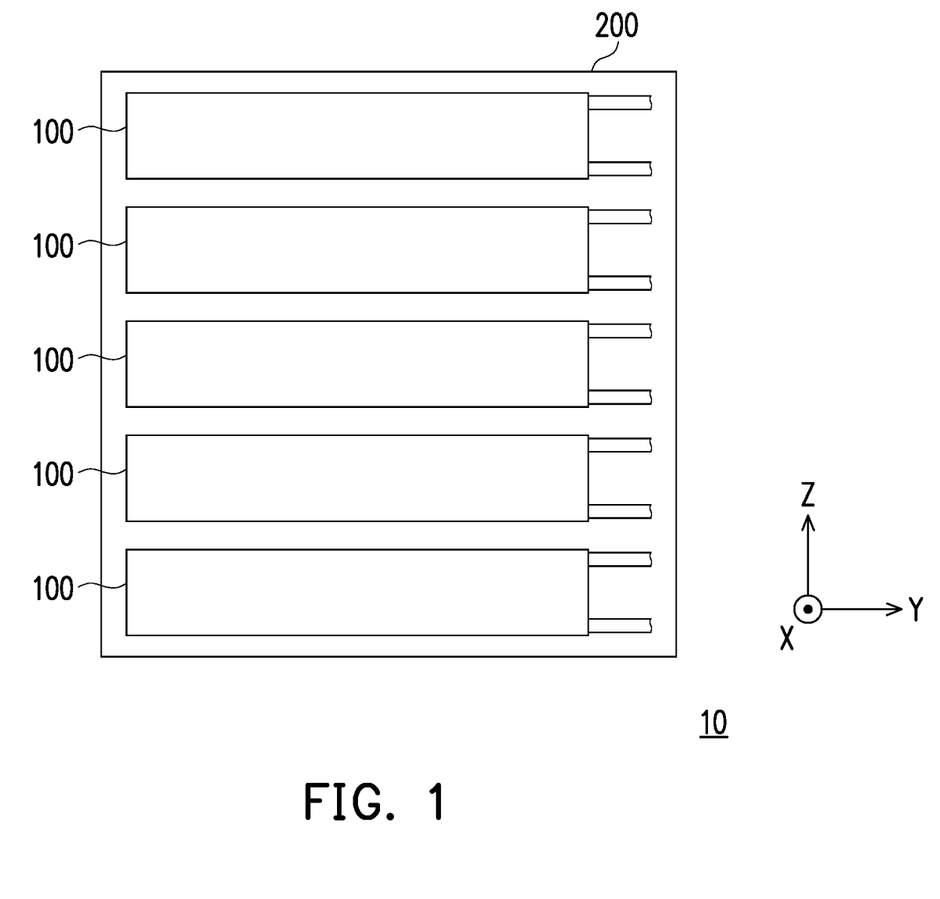
FIG. 1 is a schematic view of an electronic apparatus according to an embodiment of the disclosure.

FIG. 1 is a schematic view of an electronic apparatus according to an embodiment of the disclosure. Coordinates X-Y-Z are provided herein for the description of the components. Referring to FIG. 1, an electronic apparatus 10 includes a rack 200 and an immersion cooling unit 100. The immersion cooling unit 100 is installed in the rack 200. Five immersion cooling units 100 are shown in FIG. 1, but not limited thereto. The immersion cooling units 100 are stacked upward in a Z-axis direction in the rack 200 to enhance the space utilization of the electronic apparatus 10. A user may extract or replace the immersion cooling unit 100 in a Y-axis direction to enhance the ease of use of the immersion cooling unit 100.

The user may dispose different numbers of immersion cooling units 100 according to their needs, and the rack 200 may be disposed to match the structure of a conventional data center, so that the electronic apparatus 10 may be quickly integrated into the conventional data center. In addition, the rack 200 may also be integrated into a cabinet of a conventional cooling distribution unit (CDU) to effectively use space and enable the electronic apparatus 10 to be applied to a variety of different fields.

Figure 2A:
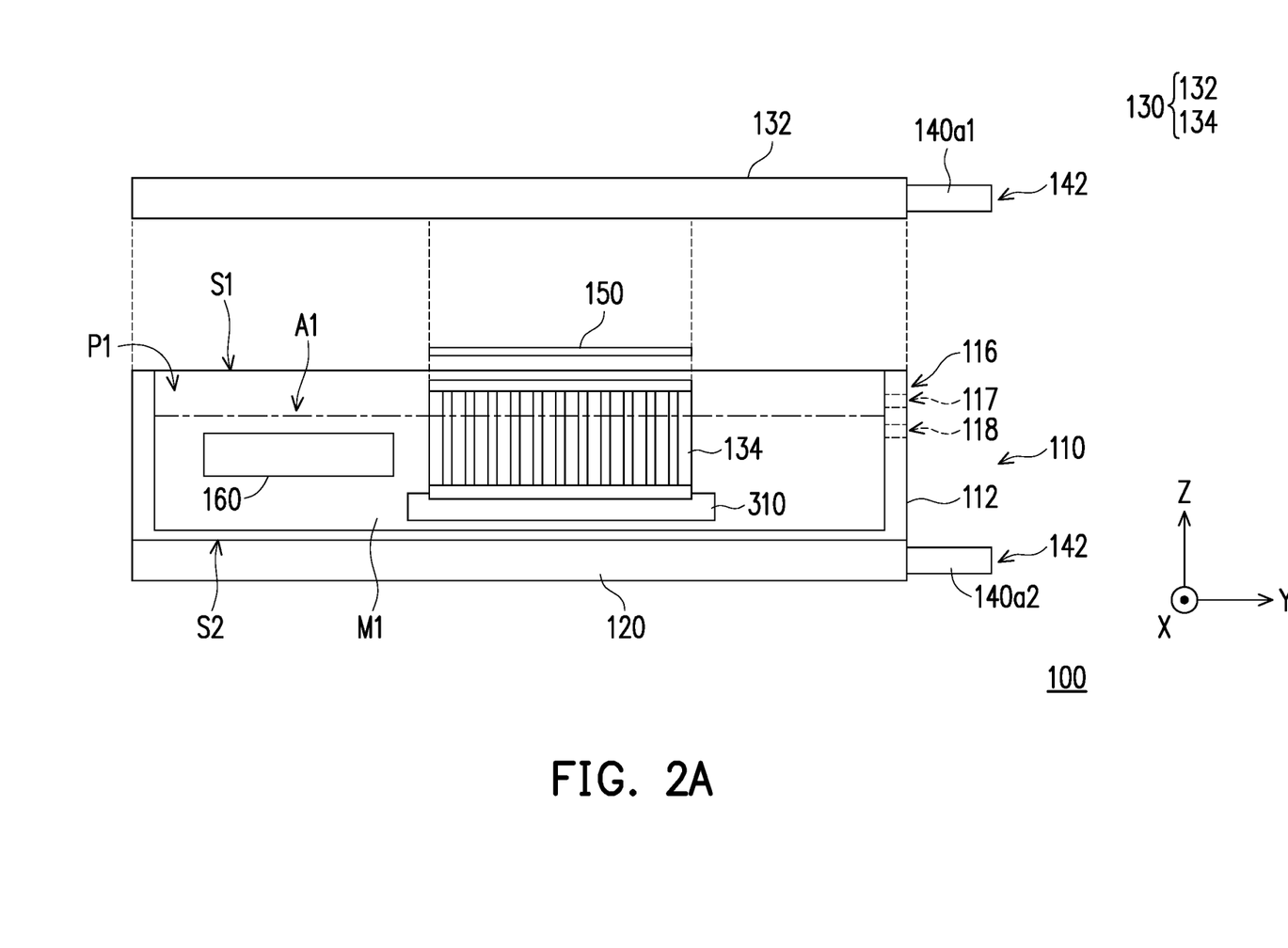
FIG. 2A is a schematic view of an immersion cooling unit of FIG. 1 before being assembled.

FIG. 2A is a schematic view of an immersion cooling unit of FIG. 1 before being assembled, where a cover portion 132 is not yet assembled to a cooling tank 110. Referring to FIG. 2A, the immersion cooling unit 100 includes a cooling tank 110, a first cooling unit 120, and a second cooling unit 130. The first cooling unit 120 and the second cooling unit 130 are disposed opposite to each other. The cooling tank 110 includes a main body 112, an accommodating portion P1 inside the main body 112, a top S1, and a bottom S2 opposite to the top S1. The first cooling unit 120 is connected to the bottom S2 of the cooling tank 110, a cooling medium M1 is accommodated in the accommodating portion P1 (the main body 112), and a heat generating component 310 is disposed in the accommodating portion P1 and is suitable for immersion in the cooling medium M1. The heat generating component 310 is, for example, a wafer, but not limited thereto.

The second cooling unit 130 includes a cover portion 132 and a connection portion 134. Here, the cover portion 132 and the connection portion 134 are two components separated from each other, but not limited thereto. Before the cover portion 132 is assembled to the cooling tank 110, the user injects the cooling medium M1 directly from the top S1 of the cooling tank 110 into the accommodating portion P1, but not limited thereto. For example, the cooling tank 110 has a cooling medium replacement portion 117, and the user may fill the cooling medium M1 through the cooling medium replacement portion 117 after the cover portion 132 is assembled to the cooling tank 110 (shown in FIG. 2B). Here, a liquid surface A1 of the cooling medium M1 in the accommodating portion P1 is represented by a dotted chain. As shown in FIG. 2A, the connection portion 134 is located in the accommodating portion P1 and contacts the heat generating component 310. The connection portion 134 is partially immersed in the cooling medium M1, and the heat generating component 310 is completely immersed in the cooling medium M1. At this time, the heat generating component 310 has a gap between the heat generating component 310 and the bottom S2 of the main body 112 without directly contacting the main body 112.

Figure 2B:
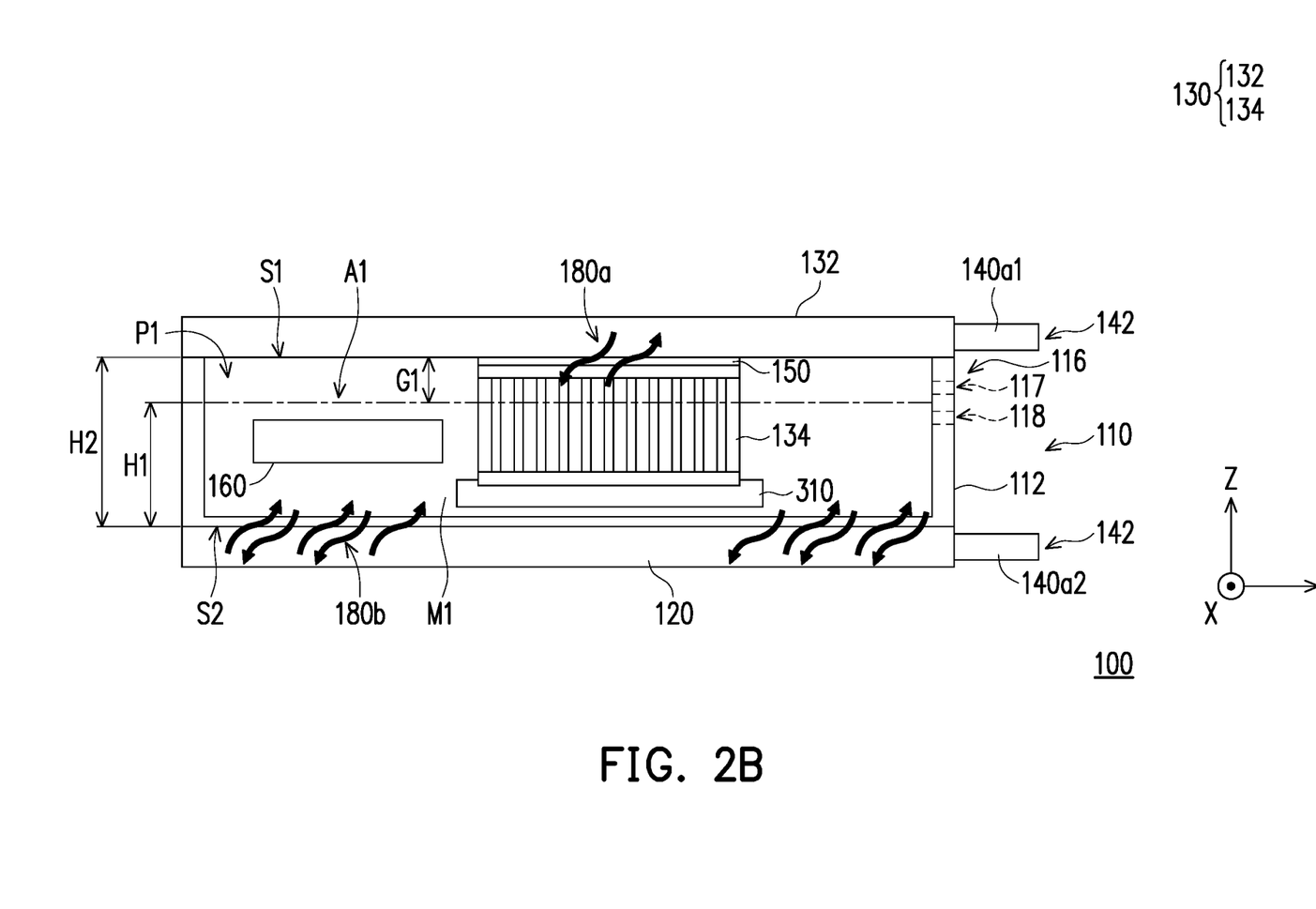
FIG. 2B is a schematic view of an immersion cooling unit of FIG. 2A after being assembled.

FIG. 2B is a schematic view of an immersion cooling unit of FIG. 2A after being assembled. Referring to FIG. 2B, after the cover portion 132 is assembled to the cooling tank 110, the cover portion 132 of the second cooling unit 130 is connected to the top S1 of the cooling tank 110 and covers the accommodating portion P1. The connection portion 134 may be considered to extend from the cover portion 132 into the accommodating portion P1 to contact the heat generating component 310. In other words, the connection portion 134 is located between the cover portion 132 and the heat generating component 310.

Heat exchange paths between the elements (e.g., the connection portion 134 and the cover portion 132 as well as the cooling medium M1 and the first cooling unit 120) is schematically drawn with arrows in FIG. 2B. Here, the heat generating component 310 in the immersion cooling unit 100 may exchange heat with the external environment through two cooling paths. Part of the heat energy of the heat generating component 310 is transferred to the cover portion 132 through the connection portion 134 and dissipated to the external environment, being a first cooling path 180a. Part of the heat energy of the heat generating component 310 is transferred to the first cooling unit 120 through the cooling medium M1 and dissipated to the external environment, being a second cooling path 180b.

Specifically, the immersion cooling unit 100 further includes two water cooling pipes 140a1 and 140a2. The two water cooling pipes 140a1 and 140a2 are respectively disposed in the cover portion 132 and the first cooling unit 120. The water cooling pipe 140a1 is embedded in the cover portion 132 and the user may fill the water cooling pipe 140a1 with a low thermal energy coolant through a water inlet 142, and the heat generating component 310 may exchange heat with the coolant in the water cooling pipe 140a1 through the connection portion 134. A high thermal energy coolant exits the water cooling pipe 140a1 through a water outlet (not shown). In this way, the heat generating component 310 may be cooled through the first cooling path 180a. Another water cooling pipe 140a2 is embedded in the first cooling unit 120, and the low thermal energy coolant in the water cooling pipe 140a2 is suitable for heat exchange with the cooling medium M1. In this way, the heat generating component 310 may be cooled through the second cooling path 180b. It can be seen that the immersion cooling unit 100 may simultaneously cool the heat generating component 310 through the first cooling path 180a and the second cooling path 180b to improve cooling efficiency of the immersion cooling unit 100 to the heat generating component 310, and make the immersion cooling unit 100 suitable for cooling the heat generating component 310 with high power.

As shown in FIG. 2A and FIG. 2B, the immersion cooling unit 100 further includes a thermal pad 150 and a submerged pump 160. The thermal pad 150 is disposed between the cover portion 132 and the connection portion 134 to enhance heat transfer efficiency between the connection portion 134 and the cover portion 132. In other words, the connection portion 134 is connected to the cover portion 132 through the thermal pad 150. The submerged pump 160 is disposed in the cooling tank 110 and immersed in the cooling medium M1. The submerged pump 160 is suitable for disturbing the cooling medium M1 and creating a circulating flow field in the accommodating portion P1 to enhance heat exchange efficiency of the immersion cooling unit 100.

In addition, the connection portion 134 is, for example, a cooling fin set to enhance heat dissipation efficiency of the connection portion 134, but not limited thereto. The connection portion 134 may also be an extension structure made integrally with the cover portion 132. It should be noted that only one connection portion 134 and one heat generating component 310 are schematically shown in FIG. 2A and FIG. 2B, but the number and locations of the connection portions 134 and the heat generating component 310 are not limited thereto. The immersion cooling unit 100 may simultaneously accommodate multiple heat generating components 310, and the second cooling unit 130 may include corresponding multiple connection portions 134. The cover portion 132 simultaneously contacts the connection portions 134 to simultaneously cool the heat generating components 310.

As shown in FIG. 2B, a depth H1 of the cooling medium M1 in the accommodating portion P1 of the cooling tank 110 is smaller than a depth H2 of the accommodating portion P1. In other words, the cooling medium M1 does not fill the accommodating portion P1, and there is a gap G1 between the liquid surface A1 of the cooling medium M1 and the cover portion 132 to save the amount of the cooling medium M1 and reduce the cost. Here, the immersion cooling unit 100 is a single-phase cooling unit. In other words, the cooling medium M1 remains liquid in the accommodating portion P1 without any phase change and remains liquid at all times.

The cooling tank 110 further includes a connection interface 116. Here, the connection interface 116 is disposed on a side of the main body 112, the connection interface 116 includes an electrical connection portion 118, and the cooling medium replacement portion 117 is located at the connection interface 116, but not limited thereto. The cooling medium replacement portion 117 is suitable for filling or leaking the cooling medium M1. An external electronic device (not shown) is suitable for electrical connection to the elements (not shown) or the heat generating component 310 in the immersion cooling unit 100 through the electrical connection portion 118.

The immersion cooling unit shown in FIG. 2A and FIG. 2B is only schematic, and the specific structure of the immersion cooling unit of the disclosure is illustrated below by drawings.

Figure 3A:
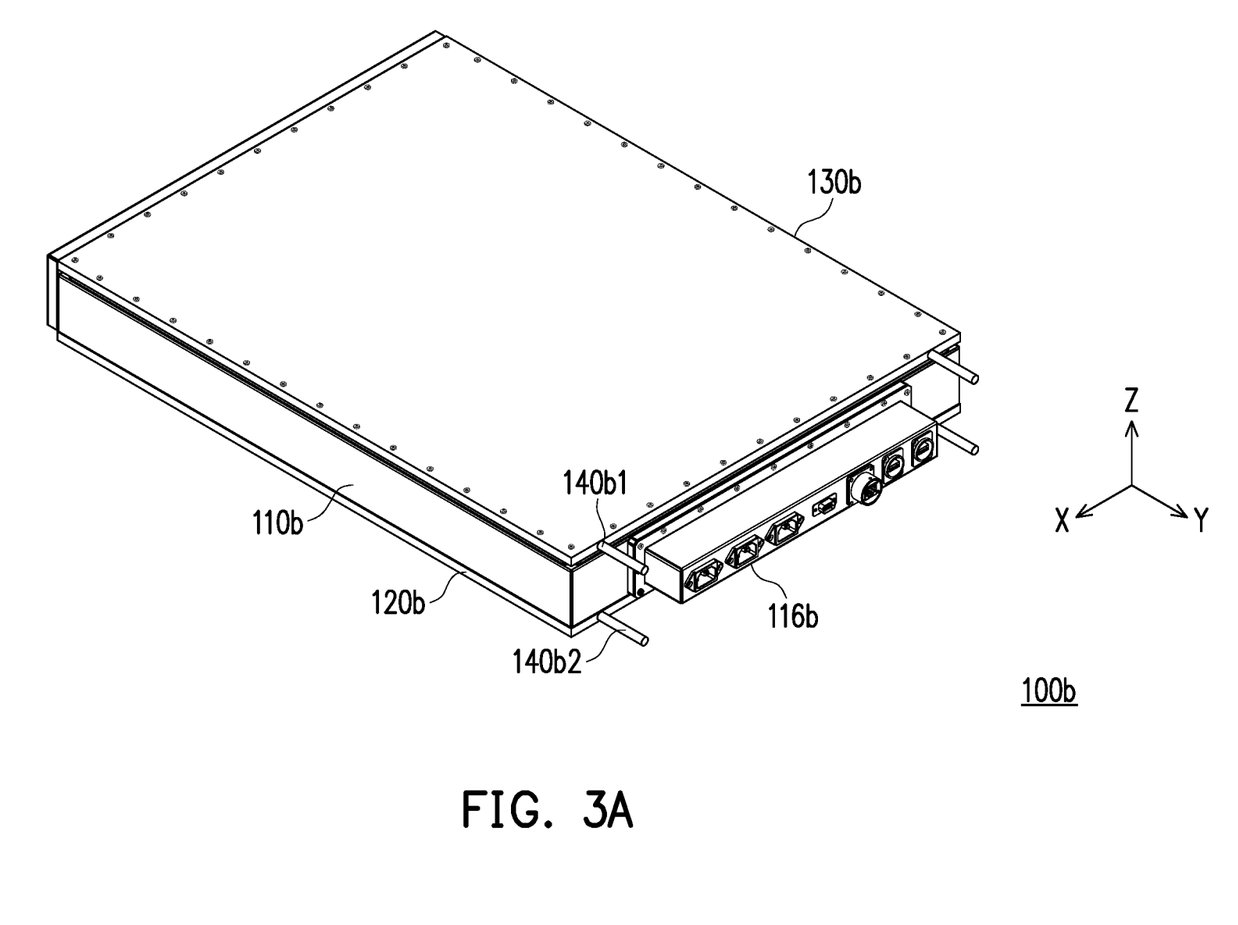
FIG. 3A is a schematic view of an immersion cooling unit according to another embodiment of the disclosure.
Figure 3B:
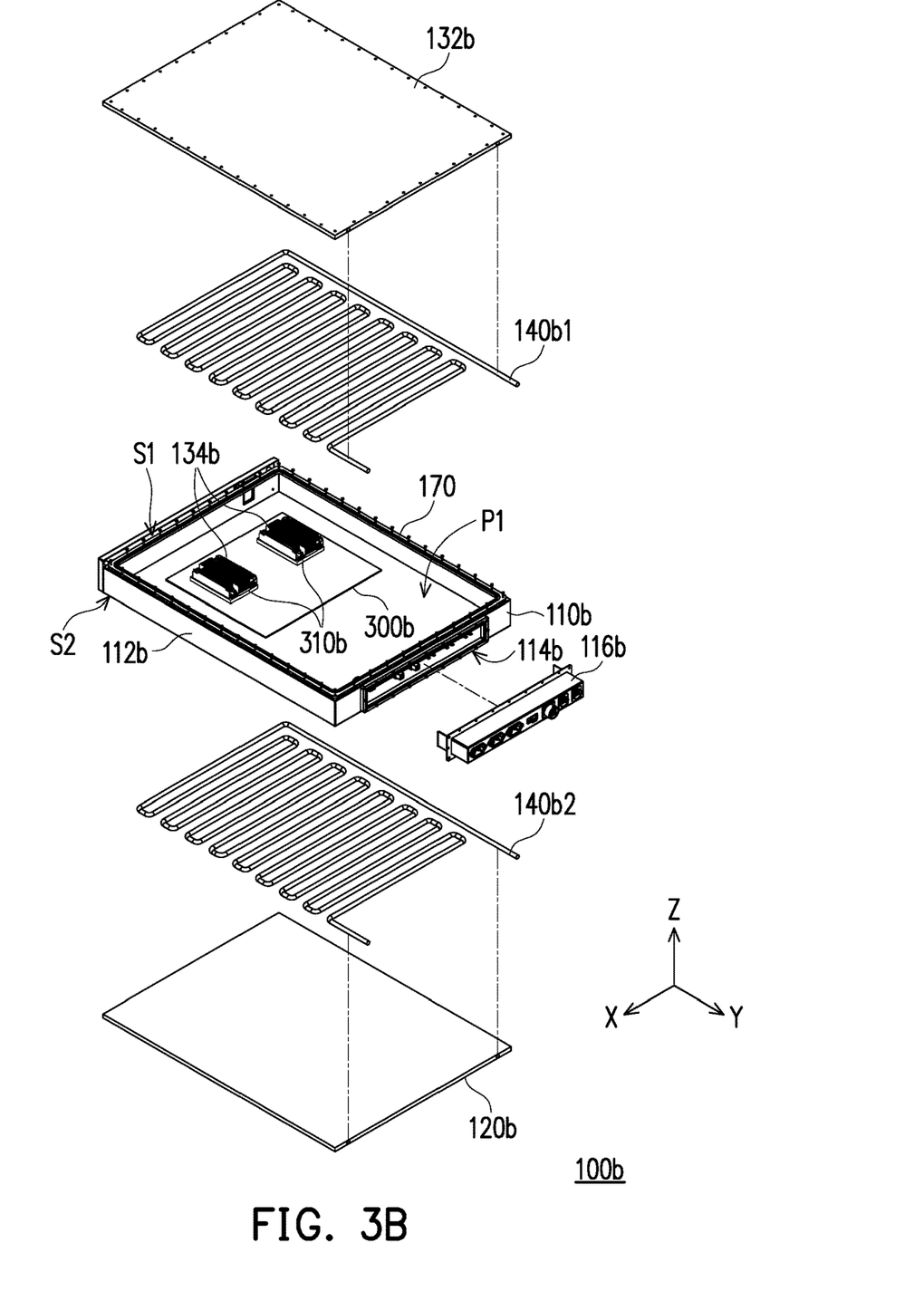
FIG. 3B is an exploded view of the immersion cooling unit of FIG. 3A.
Figure 3C:
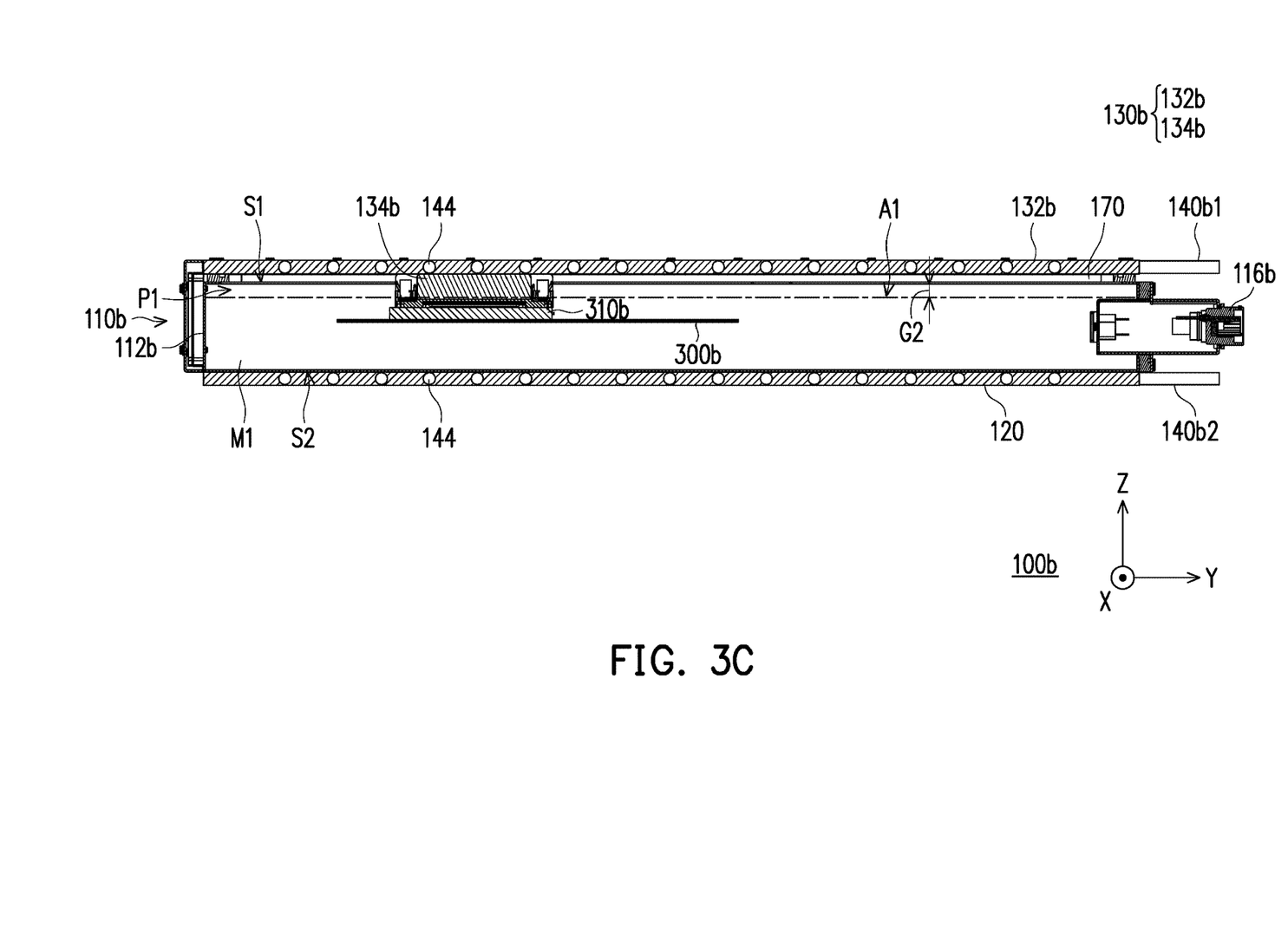
FIG. 3C is a cross-sectional view of the immersion cooling unit of FIG. 3A.

FIG. 3A is a schematic view of an immersion cooling unit according to another embodiment of the disclosure. FIG. 3B is an exploded view of the immersion cooling unit of FIG. 3A. FIG. 3C is a cross-sectional view of the immersion cooling unit of FIG. 3A. FIG. 3A to FIG. 3C illustrate the specific structure of an immersion cooling unit 100b, where the same or similar components as in the preceding embodiments are denoted by the same or similar reference numerals. Referring to FIG. 3A to FIG. 3C, a cooling tank 110b accommodates an electronic element 300b, the electronic element 300b has two heat generating components 310b, and a second cooling unit 130b includes two connection portions 134b corresponding to the two heat generating components 310b. There is a gap G2 between the liquid surface A1 of the cooling medium M1 and a cover portion 132b. A side of the cooling tank 110b includes an opening 114b, and the connection interface 116b is disposed in the cooling tank 110b through the opening 114b. Here, the electronic element 300b is, for example, a circuit board, but not limited thereto.

As shown in FIG. 3B, two water cooling pipes 140b1 and 140b2 have the same structure and piping design. Of course, the piping design of the water cooling pipes 140b1 and 140b2 is not limited thereto, and the user may change the piping design according to their needs. In addition, the immersion cooling unit 100b further includes a buffer member 170. The cover portion 132b of the second cooling unit 130b may be fastened to the top S1 of the cooling tank 110b by a fastener. The buffer member 170 is located between the cover portion 132b and the cooling tank 110b and the fastener is threaded through the buffer member 170 to provide a buffering and sealing effect when fastening the cover portion 132b. As shown in FIG. 3C, a pipe 144 of the water cooling pipe 140b1 partially overlaps with the connection portion 134b, whereby the connection portion 134b may exchange heat with the coolant in the pipe 144.

According to this embodiment, where the power of the heat generating component is 350 W and the pipe diameter of the water cooling pipe is 9.5 mm, the temperature of the heat generating component inside the immersion cooling unit may be reduced to about 67 degrees Celsius, for example.

To sum up, the first cooling unit and the cooling tank of the immersion cooling unit of the disclosure form an accommodating portion to accommodate the heat generating component and the cooling medium. The heat generating component is immersed in the cooling medium and the heat generating component does not contact the first cooling unit. The cover portion of the second cooling unit covers the accommodating portion, the connection portion of the second cooling unit is in contact with the cover portion and is located in the accommodating portion. The connection portion is in contact with the heat generating component in the accommodating portion, and the connection portion is partially immersed in the cooling medium. In this way, the heat generating component may exchange heat with the second cooling unit through the connection portion, and exchange heat with the first cooling unit through the cooling medium to improve the cooling efficiency of the immersion cooling unit on the heat generating component. In addition, the depth of the cooling medium in the cooling tank is smaller than the depth of the accommodating portion, which saves the amount of the cooling medium and reduces the cost. Moreover, the rack of the electronic apparatus may be equipped with multiple immersion cooling units, and the immersion cooling units are stacked upward in the rack to enhance the space utilization and the ease of use of the electronic apparatus. In this way, the electronic apparatus may be quickly integrated into the conventional data center and applied to the cooling distribution unit, enabling the electronic apparatus to be applied to a variety of different fields.

It will be apparent to those skilled in the art that various modifications and variations can be made to the disclosed without departing from the scope or spirit of the disclosure. In view of the foregoing, it is intended that the disclosure covers modifications and variations provided that they fall within the scope of the following claims and their equivalents.

What is claimed is:

1. An immersion cooling unit comprising:
a cooling tank comprising an accommodating portion and a top, wherein the immersion cooling unit is a single-phase cooling unit;
a first cooling unit connected to the cooling tank;
a second cooling unit, wherein the first cooling unit and the second cooling unit are disposed opposite to each other, and the second cooling unit comprises a cover portion and a connection portion, wherein the cover portion is connected to the top of the cooling tank and covers the accommodating portion, and the connection portion is connected to the cover portion and contacts a heat generating component, and the connection portion is located in the accommodating portion; and
two cooling pipes, respectively disposed in the cover portion and the first cooling unit, the two cooling pipes are filled with a coolant,
a cooling medium is accommodated in the accommodating portion of the cooling tank and the cooling medium is different from the coolant.

2. The immersion cooling unit according to claim 1, wherein the cooling tank comprises a bottom opposite to the top, and the first cooling unit is connected to the bottom of the cooling tank.

3. The immersion cooling unit according to claim 1, wherein the connection portion is a cooling fin set.

4. The immersion cooling unit according to claim 1 further comprising a thermal pad, wherein the thermal pad is disposed between the cover portion and the connection portion.

5. The immersion cooling unit according to claim 1 further comprising a submerged pump, wherein the submerged pump is disposed in the cooling tank.

6. The immersion cooling unit according to claim 1, wherein the cooling tank has a cooling medium replacement portion.

7. The immersion cooling unit according to claim 6, wherein the cooling tank comprises a main body and a connection interface, the connection interface is disposed on a side of the main body, and the cooling medium replacement portion is located at the connection interface.

8. The immersion cooling unit according to claim 7, wherein the connection interface comprises an electrical connection portion.

9. The immersion cooling unit according to claim 1, wherein there is a gap between a liquid surface of the cooling medium and the cover portion.

10. An electronic apparatus comprising:
a rack;
a heat generating component; and
an immersion cooling unit installed on the rack, the immersion cooling unit comprising:
a cooling tank comprising an accommodating portion and a top, wherein the immersion cooling unit is a single-phase cooling unit;
a first cooling unit connected to the cooling tank;
a second cooling unit, wherein the first cooling unit and the second cooling unit are disposed opposite to each other, and the second cooling unit comprises a cover portion and a connection portion, wherein the cover portion is connected to the top of the cooling tank and covers the accommodating portion, the connection portion is connected to the cover portion, the connection portion is located in the accommodating portion and contacts the heat generating component; and
two cooling pipes, respectively disposed in the cover portion and the first cooling unit, the two cooling pipes are filled with a coolant,
a cooling medium is accommodated in the accommodating portion of the cooling tank and the cooling medium is different from the coolant.

11. The electronic apparatus according to claim 10, wherein the cooling tank comprises a bottom opposite to the top, and the first cooling unit is connected to the bottom of the cooling tank.

12. The electronic apparatus according to claim 10, wherein the connection portion is a cooling fin set.

13. The electronic apparatus according to claim 10, wherein the immersion cooling unit comprises a thermal pad, wherein the thermal pad is disposed between the cover portion and the connection portion.

14. The electronic apparatus according to claim 10, wherein the immersion cooling unit comprises a submerged pump, wherein the submerged pump is disposed in the cooling tank.

15. The electronic apparatus according to claim 10, wherein the cooling tank has a cooling medium replacement portion.

16. The electronic apparatus according to claim 15, wherein the cooling tank comprises a main body and a connection interface, the connection interface is disposed on a side of the main body, and the cooling medium replacement portion is located at the connection interface.

17. The electronic apparatus according to claim 16, wherein the connection interface comprises an electrical connection portion.

18. The electronic apparatus according to claim 10, wherein there is a gap between a liquid surface of the cooling medium and the cover portion.

* * * * *